United States Patent [19]
Ehrsam et al.

[11] Patent Number: 4,801,379
[45] Date of Patent: Jan. 31, 1989

[54] MICROFILTER FOIL AND METHOD OF PRODUCING SAME

[75] Inventors: Christian Ehrsam, Winterthur; Thomas Ruegg, Gachnang, both of Switzerland

[73] Assignee: Sulzer Brothers Limited, Winterthur, Switzerland

[21] Appl. No.: 73,812

[22] Filed: Jul. 15, 1987

[30] Foreign Application Priority Data

Jul. 23, 1986 [CH] Switzerland .................. 2945/86

[51] Int. Cl.⁴ .................. B01D 13/04; B01D 29/04
[52] U.S. Cl. .................. 210/498; 204/11; 204/15; 210/500.25; 210/500.27; 264/42; 264/DIG. 48; 264/DIG. 70
[58] Field of Search .................. 210/500.25, 500.26, 210/483, 496, 500.1, 500.22, 500.24, 500.27, 500.35, 500.36, 500.42, 500.43; 264/22, 41, 42, 45.1, DIG. 48, DIG. 70; 204/11, 15

[56] References Cited

U.S. PATENT DOCUMENTS

| | | | |
|---|---|---|---|
| 2,226,381 | 12/1940 | Norris | 204/11 |
| 2,230,868 | 2/1941 | Kuhlman | 204/11 |
| 3,695,927 | 10/1972 | Futterer | 204/11 |
| 4,575,406 | 3/1986 | Slafer | 204/11 |

Primary Examiner—Frank Sever
Attorney, Agent, or Firm—Kenyon & Kenyon

[57] ABSTRACT

The microfilter foil is made of an inorganic substance such as metal with opened pores. Each pore is formed with a channel which increases in cross-section from the crest so as to obviate clogging. The foil is produced by exposure of a photosensitive layer of paint or lacquer with the use of an interference pattern produced by monochromatic and coherent light. A skin of inorganic material is produced on the photosensitive layer and portions of the skin are thereafter removed from the coated teeth in order to produce the pores in the subsequently formed foil.

16 Claims, 3 Drawing Sheets

MICROFILTER FOIL AND METHOD OF PRODUCING SAME

This invention relates to a microfilter foil and to a method of producing a microfilter foil.

Heretofore, microfilter foils have been used as surface-type filters, particular for use as a filter medium for cross-flow filtration. In such cases, since no filter cake is to be deposited on the filter medium during a cross-flow filtration, filtration can be continuous. Further, the pores of such microfilter foils can be made smaller than the size of bacteria having cell sizes which are at least 0.2 $\mu$m. Thus, continuous disinfecting filtration is possible with such foils.

As is known, disinfecting filtration is a physical process which enables bacteria and other micro-organisms to be removed from liquids and gases and is of use, for example, in the drug, cosmetic and beverage industries as well as in biotechnology. Microfilters have also been used for fine clarification and for the special cleaning of liquids and gases, particularly in microelectronics.

U.S. Pat. No. 4,575,406 describes a metal microfilter foil which is produced by a process in which a photosensitive layer of paint or lacquer is applied to a substrate having a planar surface. After exposure to an interference pattern produced by means of monochromatic and coherent light waves of a laser and subsequent development, a relief forms as a photosensitive layer. As described, the relief has depressions distributed in a lattice form in the layer. In a subsequent step, the relief surface is covered by an electrically conductive layer with the depressions either remaining uncovered or, if they have already been covered, subsequently being filled up with an insulant. Thereafter, the filter foil is produced in an electrodeposition process. To this end, the substrate is dipped into an electrodeposition bath. Pores are then formed above the depressions in the electrolytically produced layer.

Since the electrolytically produced layer increases not only in height but also laterally as well above the depressions, the pores which arise have constrictions. That is, the pores have the smallest diameter inside the filter layer. Thus, there is bound to be clogging of the pores during operation as a filter medium since the particles which are to be filtered out from a medium may be deposited in the pores. As a result, such particles may act in the same fashion as a valve lid on a valve seat to inhibit the throughflow of filtrate.

Another disadvantage in the production of the known microfilters is the risk of soiling. This risk arises in electrolytic processes due to the soiling of the galvanic bath and is avoidable only at considerable expense. There is also a risk in the preparation of the paint or lacquer relief particularly when the depressions are filled up with insulant. That is, there is a risk that impurities may be deposited on the conductive layer of the relief. In such cases, pores of different sizes may then arise or no metal layer at all may form on spots covering two or more pores.

Accordingly, it is an object of the invention to provide a microfilter foil made of an inorganic substance in which pores are distributed very uniformly and are of substantially the same size and in which the risk of clogging in operation is substantially obviated.

It is another object of the invention to construct a microfilter foil in a manner which reduces the risk of clogging during operation.

It is another object of the invention to provide a relatively simple process for manufacturing microfilter foils of reliable construction.

It is another object of the invention to increase the reliability of a microfilter foil.

Briefly, the invention provides a microfilter foil of inorganic material having a filtering surface on one side, a plurality of discrete hollow protuberances extending from the surface with each protuberance having a pore opening at a crest thereof and a pore channel extending therethrough with an increasing cross-section in a direction from the crest.

The microfilter foil is of asymmetrical structure, that is, the foil is to function in one direction.

The pores of the foil are of substantially the same size and have an average diameter of approximately from 0.1 to 1 $\mu$m. In addition, the foil may be constructed with a thickness substantially equal to the average pore diameter while the pores are spaced apart a distance of from two to five times the average pore diameter.

The pore openings may also be sized so that the openings in any two directions perpendicular to one another are of the same diameter. Alternatively, the openings in any two directions perpendicular to one another may be of different diameters. Also, the openings may be made of slot-like shape and the openings may either be coplanar or may have non-planar edges.

The invention also provides a method of producing a microfilter foil. This method includes the steps of forming a photosensitive layer of a material selected from the group consisting of paint and lacquer or the like on a substrate, of exposing the photosensitive layer to an interference pattern produced with monochromatic and coherent light to form a relief surface having a plurality of discrete protuberances thereon and forming a skin of inorganic material on and over the protuberances of the relief surfaces. Thereafter, the inorganic material is removed from over the protuberances along with a portion of each protuberance to define perforations in the skin. Thereafter, the remainder of the photosensitive layer is removed to obtain a foil of inorganic material with a plurality of discrete protuberances each of which has a pore opening in a crest thereof.

In one embodiment, where the relief surface includes upright teeth, troughs and saddles, the inorganic material may be broken off from above the teeth. In an alternative method, a layer of inorganic material may be peeled off from the skin with the remaining inorganic material defining the foil.

The microfilter foil may be made of any suitable inorganic material such as a metal, for example, gold, nickel, titanium, and alloys such as of gold and palladium, or some other inorganic substance such as titanium nitride.

These and other objects and advantages of the invention will become more apparent from the following detailed description taken in conjunction with the accompanying drawings wherein:

FIG. 1b illustrates a modified interference pattern produced in a manner similar to that shown in FIG. 1a;

Figure 1A:
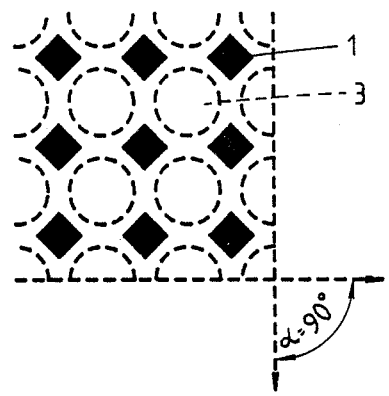
FIG. 1a illustrates a plan view of an interference pattern produced in a photosensitive paint or lacquer layer in accordance with the invention.
Figure 1B:
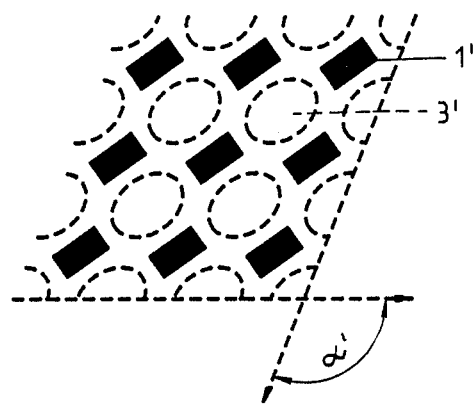
Figure 1C:
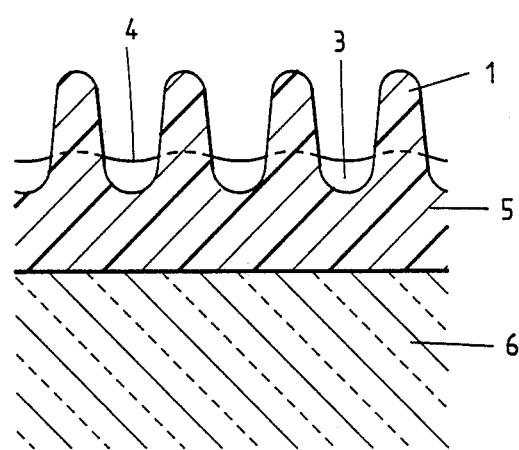
Figure 1D:
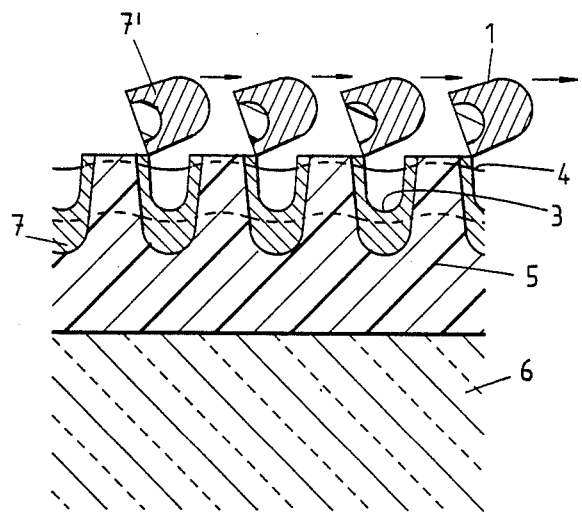
Figure 1E:
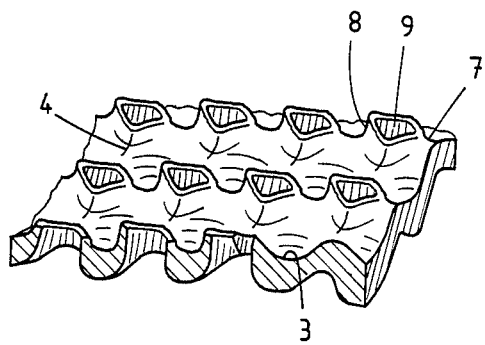
Figure 2A:
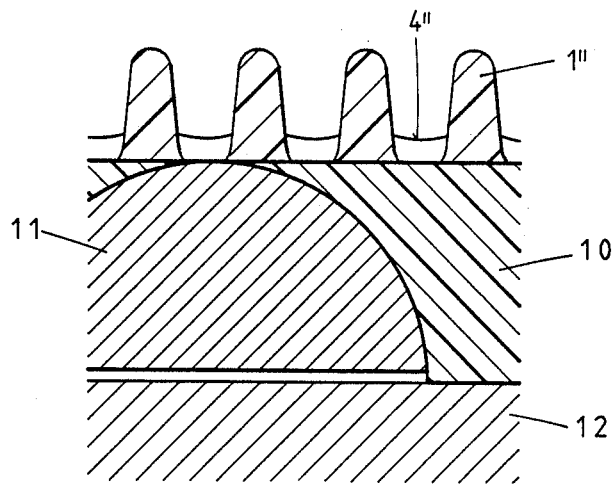
Figure 2B:
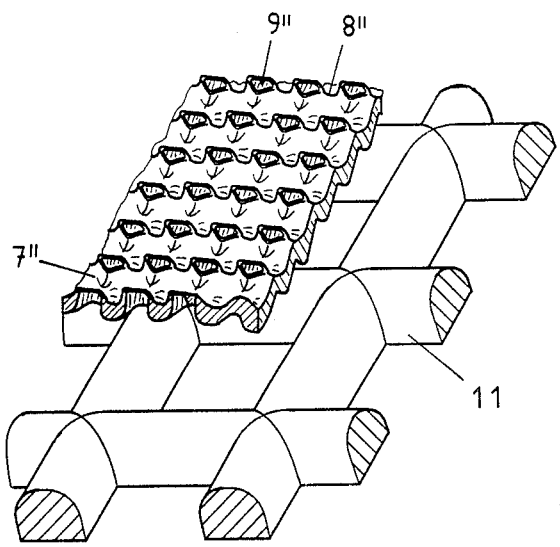
Figure 3:
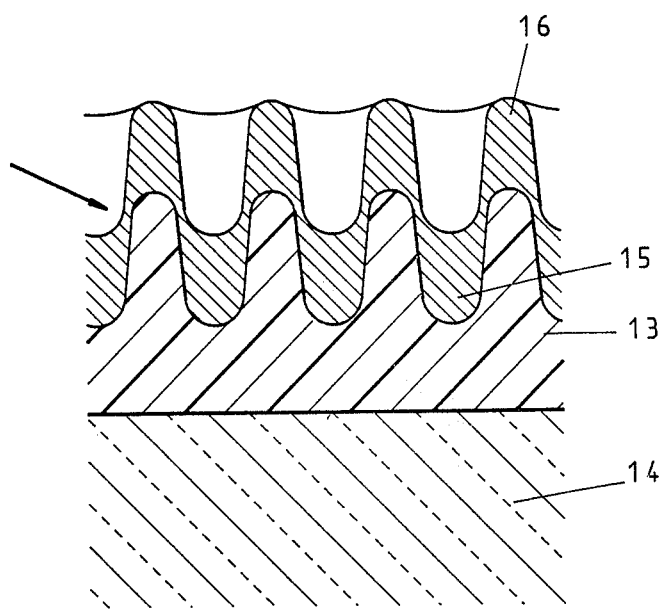

FIG. 1c diagrammatically illustrates a partial longitudinal sectional view through a relief layer on a substrate at an intermediate stage of production of a microfilter foil in accordance with the invention;

FIG. 1d illustrates a diagrammatic partial longitudinal sectional view during a removal stage in the manufacture of a microfilter foil in accordance with the invention;

FIG. 1e illustrates a perspective view of a part of a finished microfilter foil in accordance with the invention;

FIG. 2a illustrates a partial longitudinal sectional view of a photosensitive layer deformed into a relief shape on a support structure;

FIG. 2b illustrates a part perspective view of a part of a microfoil filter on a support structure in accordance with the invention; and FIG. 3 illustrates a partial longitudinal sectional view of a skin of inorganic material on a relief surface and substrate prior to a removal step in the manufacture of a microfilter foil in accordance with the invention.

Referring to FIG. 1c, in order to produce a microfilter foil, a photosensitive layer 5 made of a material, for example, selected from the group consisting of paint and lacquer is formed on a substrate 6, for example, a glass plate. Alternatively, instead of using a transparent glass plate, use may be made of filter glass or of a glass plate which reflects, at most, 3% of the incident light. A light-absorbing layer may also be applied to the back of a glass substrate so that reflection of incident rays which might cause variations in the intensity of exposure and, therefore, a variation in a required relief surface is obviated while an interference pattern is being produced.

Referring to FIGS. 1a and 1c, the photosensitive layer 5 has a relief surface which is composed of a plurality of discrete protuberances in the form of slender upwardly narrowing teeth 1 with troughs 3 and saddles 4 in between. The tooth height is, for example, from two to three times the average tooth diameter. As indicated in FIG. 1a, the relief surface is formed by exposing the photosensitive layer to an interference pattern produced with monochromatic and coherent light. In this respect, two coherent beam pencils of equal intensity are superimposed on one another by means of a special optical system and projected onto the photosensitive layer. In this respect, laser beams may be used as the light source in order to meet the requirements of coherence and monochromatism. As indicated, the interference pattern is produced by two exposures with line lattices, the exposures being superimposed upon one another crosswise. As indicated, the second lattice orientation has been turned through an angle $\alpha$ of 90° relative to the first lattice orientation. In this case, square cross-section teeth having rounded corners arise after development.

Referring to FIG. 1b, the interference pattern maybe produced in a similar manner as above except that the two lattice orientations may include an angle $\alpha'$ of greater than 90° so that the resulting teeth 1' have elongated cross-sections. The saddles 3' are similarly of elongated shape.

Another possibility is to produce interference patterns in a photosensitive layer of paint or the like by means of three monochromatic and coherent beams. In this case, only a single exposure is required to produce a dot lattice.

Referring to FIG. 1d, after the photosensitive layer 5 has been formed on the substrate 6 and the layer 5 exposed to an interference pattern as indicated in either of FIGS. 1a and 1b, a skin 7 of inorganic material is formed on and over the relief surface of the layer 5 and, particularly, over the teeth 1. The formation of the skin 7 may be produced by cathode sputter or vacuum vapor coating. Thereafter, the inorganic material 7' is removed from over the teeth 1 along with a portion of each tooth 1 in order to define subsequent perforations in the remainder of the skin 7. In this respect, the coated teeth 1 are bent so that the projecting portions of the skin as well as a portion of each tooth 1 is removed as indicated by the arrows in FIG. 1d.

Thereafter, the remainder of the photosensitive layer 5 is removed from the remainder of the skin 7 to obtain a foil of inorganic material with a plurality of discrete protuberances 8, each of which has a pore opening 9 in a crest thereof. As indicated, the protuberances 8 are of frustum-shape. In addition, as indicated in FIG. 1d, the resulting pore channel extends through each protuberance 8 with an increasing cross-section in a direction from the crest.

In forming the photosensitive layer 5 as indicated in FIG. 1c, the thickness of the layer 5 is made, for example, ten times the diameter of a pore which is to be formed. In this respect, the pores are substantially the same size and have an average diameter of approximately from 0.1 to 1 $\mu$m. Further, the teeth 1 are positioned so as to provide a spacing between the pores of a distance of from two to five times the average pore diameter. Further, the required shaping of the relief layer is determined by the length and intensity of the exposure and subsequent development in accordance with the interference pattern.

The thickness of the completed foil is substantially equal to the average pore diameter. In this respect, the amount of inorganic material applied to the photosensitive layer 5 is such to accommodate this thickness. Since the paint or lacquer from which the photosensitive layer 5 is made is brittle, the teeth 1 may break readily. Thus, the teeth can be bent, for example, by being rubber over by resilient fibers disposed, for example on a rotating roll with each spot or dot being passed over at least once. The edge parts arising during bending or not smooth but are non-planar, thus making it more difficult for particulate material to stick during filtering. The metal applied to the teeth tips can be removed, for example, by electropolishing.

Referring to FIG. 2a, a microfilter foil in accordance with the above may be fabricated directly on a support structure for subsequent use as a surface-type filter. In this respect, a relief surface may be formed on a photosensitive layer so as to define a plurality of teeth 1" and saddles 4", for example, as described above with respect to FIG. 1c. As a variant, the trough-like depressions extend as far as the surface of a substrate 10. In addition, the substrate 10 may be formed as a screen-like support structure having webs 11 produced, for example, by electrodeposition. The support structure 10 is, in turn, secured to a planar plate 12 while the gaps in the support structure are filled up with a light-absorbing material.

During manufacture, at places where the photosensitive layer has been removed from the webs 11, rigid connections arise between the microfilter foil and the screen like support structures so that the webs 11 define a filter support structure as indicated in FIG. 2b.

As indicated in FIG. 2b, the microfilter foil 7" has a plurality of protuberances 8" with pores 9" and is supported directly on the webs 11.

Referring to FIG. 3, a microfilter foil may be produced in an alternative manner. In this case, the interference pattern is produced in a photosensitive layer 13 which is applied to a planar glass plate 14 as above. However, in this case, the relief surface is formed with aperture-like depressions 15 with the exposure times being shorter. An inorganic skin 16 is applied to the relief surface and a layer of this skin is removed by peeling off with the remaining inorganic material defining the foil. As indicated, the skin is pulled off in the direction indicated by the arrow and the removed layer carries along the upper portions of the teeth from the photosensitive layer in order to form the pore openings.

The invention thus provides a microfilter foil which can be used for cross-flow filtration without clogging.

The invention further provides a method of producing a microfilter foil in a relatively simple manner.

What is claimed is:

1. A microfilter foil of inorganic material having a filtering surface on one side, a plurality of discrete hollow protuberances extending from said surface, each said protuberance having a pore opening at a crest thereof and a pore channel extending therethrough with an increasing cross-section in a direction from said crest.

2. A microfilter foil as set forth in claim 1 wherein said foil is a one-piece asymmetrical structure.

3. A microfilter foil as set forth in claim 1 wherein said pores are of substantially the same size and have an average diameter of approximately form 0.1 to 1 $\mu$m.

4. A microfilter foil as set forth in claim 3 wherein said foil is of a thickness substantially equal to said average pore diameter.

5. A microfilter foil as set forth in claim 3 wherein said pores are spaced apart a distance from two to five times said average pore diameter.

6. A microfilter foil as set forth in claim 3 wherein discrete pore openings in any two directions perpendicular to one another are of the same diameter.

7. A microfilter foil as set forth in claim 3 wherein discrete pore openings in any two directions perpendicular to one another are of different diameters.

8. A microfilter foil as set forth in claim 7 wherein each pore opening is of slot-like shape.

9. A microfilter foil as set forth in claim 1 wherein said pore openings have non-planar edges.

10. A microfilter foil as set forth in claim 1 wherein said pore openings are coplanar.

11. In combination
    a microfilter foil of inorganic material having a filtering surface on one side, a plurality of discrete hollow protuberances extending from said surface, each said protuberance having a pore opening at a crest thereof and a pore channel extending therethrough with an increasing cross-section in a direction from said crest; and
    an open-pore support structure supporting said foil on a side opposite said one side and having pore openings of greater size than said pore openings of said foil.

12. A method of producing a microfilter foil comprising the steps of
    forming a photosensitive layer of a material selected from the group consisting of paint and lacquer on a substrate;
    exposing the photosensitive layer to an interference pattern produced with monochromatic and coherent light to form a relief surface having a plurality of discrete protuberances thereon;
    forming a skin of inorganic material on and over said protuberances of said relief surfaces;
    thereafter removing inorganic material from over said protuberances along with a portion of each protuberance to define perforations in said skin; and
    removing the remainder of the photosensitive layer to obtain a foil of inorganic material with a plurality of discrete protuberances, each said protuberance having a pore opening in a crest thereof.

13. A method as set forth in claim 12 wherein the relief surface includes upright teeth, troughs and saddles, and wherein the inorganic material is broken off from above said teeth.

14. A method as set forth in claim 12 wherein said step of removing inorganic material includes peeling of a layer of inorganic material from said skin with the remaining inorganic material defining the foil.

15. A method as set forth in claim 12 wherein the skin is formed by cathodic separation.

16. A method as set forth in claim 12 wherein the substrate is a glass plate reflecting at most 3% of the incident light.

* * * * *

UNITED STATES PATENT AND TRADEMARK OFFICE
CERTIFICATE OF CORRECTION

PATENT NO. : 4,801,379

DATED : January 31, 1989

INVENTOR(S) : Christian Ehrsam

It is certified that error appears in the above-identified patent and that said Letters Patent is hereby corrected as shown below:

```
Column 1, line  8 change "particular" to -particularly-
Column 3, line 52 change "maybe" to -may be-
Column 4, line 39 change "or" to -are-
Column 5, line 27 change "form" to -from-
```

Signed and Sealed this

Seventeenth Day of October, 1989

Attest:

DONALD J. QUIGG

Attesting Officer

Commissioner of Patents and Trademarks